(12) United States Patent
Reimer et al.

(10) Patent No.: US 8,716,136 B1
(45) Date of Patent: May 6, 2014

(54) METHOD OF FORMING A SEMICONDUCTOR STRUCTURE INCLUDING A WET ETCH PROCESS FOR REMOVING SILICON NITRIDE

(71) Applicant: GLOBALFOUNDRIES Inc., Grand Cayman, KY (US)

(72) Inventors: Berthold Reimer, Dresden (DE); Johannes von Kluge, Dresden (DE); Sven Beyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/655,844

(22) Filed: Oct. 19, 2012

(51) Int. Cl.
*H01L 21/311* (2006.01)

(52) U.S. Cl.
USPC ............................. 438/696; 438/757; 216/46

(58) Field of Classification Search
USPC ...................................... 438/696, 757; 216/46
See application file for complete search history.

(56) References Cited

U.S. PATENT DOCUMENTS

2005/0280104 A1* 12/2005 Li ................................... 257/406
2009/0081840 A1* 3/2009 Park et al. ..................... 438/287

* cited by examiner

*Primary Examiner* — Roberts Culbert
(74) *Attorney, Agent, or Firm* — Amerson Law Firm, PLLC

(57) ABSTRACT

A method disclosed herein includes providing a semiconductor structure comprising a transistor, the transistor comprising a gate electrode and a silicon nitride sidewall spacer formed at the gate electrode. A wet etch process is performed. The wet etch process removes at least a portion of the silicon nitride sidewall spacer. The wet etch process comprises applying an etchant comprising at least one of hydrofluoric acid and phosphoric acid.

19 Claims, 3 Drawing Sheets

METHOD OF FORMING A SEMICONDUCTOR STRUCTURE INCLUDING A WET ETCH PROCESS FOR REMOVING SILICON NITRIDE

BACKGROUND OF THE INVENTION

1. Field of the Invention

Generally, the present disclosure relates to the field of integrated circuits, and, more particularly, to the selective etching of a material comprising silicon nitride.

2. Description of the Related Art

Integrated circuits typically comprise a large number of circuit elements, which include, in particular, field effect transistors. In a field effect transistor, a gate electrode can be separated from a channel region by a gate insulation layer that provides an electrical insulation between the gate electrode and the channel region. Adjacent the channel region, a source region and a drain region are formed.

The channel region, the source region and the drain region can be formed in a semiconductor material, wherein the doping of the channel region is inverse to the doping of the source region and the drain region. Thus, there is a PN transition between the source region and the channel region, and between the channel region and the drain region. Depending on an electric voltage applied to the gate electrode, the field effect transistor can be switched between an on-state, wherein there is a relatively high electrical conductance between the source region and the drain region, and an off-state, wherein there is a relatively low electrical conductance between the source region and the drain region.

FIG. 1a shows a schematic cross-sectional view of a semiconductor structure 100 comprising a field effect transistor 102 in a first stage of a method of manufacturing the field effect transistor 102.

The semiconductor structure 100 comprises a substrate 101, and a semiconductor layer 103 formed on the substrate 101. The field effect transistor 102 further comprises a source region 104 and a drain region 105 that are formed in the semiconductor layer 103, and a gate electrode 108 that is separated from the semiconductor layer 103 by a gate insulation layer 107. A portion of the semiconductor layer 103 between the source region 104 and the drain region 105 and below the gate electrode 108 forms a channel region of the field effect transistor 102.

The source region 104, the drain region 105 and the gate electrode 108 may comprise silicide portions 120, 121 and 110, respectively. Adjacent the gate electrode 108, a silicon dioxide sidewall spacer 112 and a silicon nitride sidewall spacer 114 may be provided. A first liner layer 111 may be formed between the silicon dioxide sidewall spacer 112 and the gate electrode 108, and a second liner layer 113 may be formed between the silicon nitride sidewall spacer 114 and the silicon dioxide sidewall spacer 112. The first liner layer 111 may comprise silicon nitride, and the second liner layer 113 may comprise silicon dioxide.

The semiconductor structure 100 as shown in FIG. 1a may be formed by means of known manufacturing processes which may, in particular, include ion implantation processes for introducing dopant materials into the semiconductor layer 103, the source region 104 and the drain region 105, so that the doping of the source region 104 and the drain region 105 is inverse to the doping of the channel region. Absorption of ions by the silicon dioxide sidewall spacer 112 and/or the silicon nitride sidewall spacer 114 may be used for providing desired dopant profiles in the source region 104 and the drain region 105.

The silicide portions 120, 121, 110 in the source region 104, the drain region 105 and the gate electrode 108 may improve the electrical conductivities of the source region 104, the drain region 105 and the gate electrode 108, respectively. The silicide portions 120, 121, 110 may be formed by depositing a metal layer over the semiconductor structure 100 and initiating a chemical reaction between the metal and the semiconductor material in the layer 103 and the gate electrode 108, for example, by thermal activation.

After the formation of the source region 104, the drain region 105 and the silicide portions 120, 121, 110, a reactive ion etch (RIE) process may be performed for selectively removing a portion of the silicon nitride sidewall spacer 114, as shown schematically in FIG. 1a by arrows 122.

Reactive ion etching is a dry etch process, wherein ions and radicals are provided by an electric glow discharge that is created in a reactant gas. On the surface of the semiconductor structure 100, chemical reactions between materials of the semiconductor structure 100 and the ions and/or radicals may occur. Additionally, the surface of the semiconductor structure 100 may be bombarded with energetic ions, which may cause a sputtering of the surface. Due to the chemical reactions, and due to the sputtering, material may be removed from the surface of the semiconductor structure 100.

A selectivity of the reactive ion etch process 122 may be obtained by an appropriate selection of the reactant gas, and by an adaptation of parameters such as the pressure of the reactant gas and the power of the electric discharge. For selectively removing the silicon nitride sidewall spacer 114, the reactive ion etch process 122 may be adapted such that the silicon nitride of the silicon nitride sidewall spacer 114 is removed at a greater etch rate than other materials of the semiconductor structure 100. Thus, in the reactive ion etch process 122, the size of the silicon nitride sidewall spacer 114 may be reduced, as shown in FIG. 1b.

FIG. 1b shows a schematic cross-sectional view of the semiconductor structure 100 in a later stage of the manufacturing process.

After the reactive ion etch process 122, a stressed dielectric layer 116 may be formed over the semiconductor structure 100. The stressed dielectric layer 116 may comprise silicon nitride and may have a tensile stress. An etch stop liner 115, which may comprise silicon dioxide, may be formed below the stressed dielectric layer 116.

The stressed dielectric layer 116 having a tensile stress may improve the mobility of electrons in the channel region of the field effect transistor 102, which may be particularly helpful if the field effect transistor 102 is an N-channel transistor. The stressed dielectric layer 116 may be removed from P-channel transistors in the semiconductor structure 100 by processes comprising lithography and etching, and a stressed dielectric layer having a compressive stress (not shown) may be formed over the P-channel transistors for improving the mobility of holes in the channel regions of the P-channel transistors.

By removing a part of the silicon nitride sidewall spacer 114 before forming the stressed dielectric layer 116, the pitch between the sidewall spacers of adjacent field effect transistors in the semiconductor structure 100 can be enlarged. This allows the creation of a thicker stressed dielectric layer 116, while avoiding the formation of voids in the stressed dielectric layer 116. Such voids might be filled with an electrically conductive material, such as tungsten, when electric contacts of the field effect transistor 102 are formed, leading to electrical shorts. A thicker stressed dielectric layer 116 can create a higher stress in the channel region of the field effect transistor 102. Moreover, by removing a part of the silicon nitride sidewall spacer 114, the stressed dielectric layer 116 can be provided at a smaller distance to the channel region. This may also be helpful for providing a higher stress in the channel region.

However, etching the silicon nitride sidewall spacer 114 by means of a reactive ion etch process as described above can have specific issues associated therewith, which will be explained in the following.

Depending on the techniques employed for forming the transistor 102 as shown in FIG. 1a, the silicon nitride sidewall spacer 114 may have small overhangs 119, wherein the silicon nitride sidewall spacer 114 extends to a slightly greater distance from the gate electrode 108 than the second liner layer 113, as shown in FIG. 1a. Below the overhangs 119, portions of the semiconductor material of the semiconductor layer 103 may be exposed adjacent the silicide portions 120, 121. Since typical reactive ion etch processes employed for the etching of silicon nitride are not selective to semiconductor materials such as silicon, pits 118, as shown in FIG. 1b, may be formed at locations where the material of the semiconductor layer 103 is exposed. The pits 118 may increase the electrical resistance between the silicide portions 120, 121 and the channel region of the transistor 102, which can adversely affect the performance of the transistor 102.

Moreover, during the reactive ion etch process 122, sputtering of the silicide in the silicide portions 120, 121, 110 may occur, so that the silicide gets slightly attacked and degraded, and metal particles from the silicide are included into portions of the stressed dielectric layer 116 in the vicinity of the gate electrode 108. Thus, a silicide corona 117, wherein the material of the stressed dielectric layer 116 comprises material sputtered from the silicide in portions 120, 121, 110, may be formed. The silicide corona 117 may increase the fringe capacity between the gate electrode 108 and electrical contacts formed for providing electrical connection to the source region 104 and the drain region 105, in particular in N-channel transistors, wherein the stressed dielectric layer 116 is not removed. This may adversely affect the AC performance of N-channel transistors. Moreover, the degrading of the silicide may lead to a greater contact resistance between the silicide and contact vias contacting the source region 104 and the drain region 105, or even to a loss of the electrical contact to the source region 104 and/or the drain region 105.

In view of the situation described above, the present disclosure relates to techniques that allow an improvement of the quality of transistors that are formed by means of manufacturing techniques wherein features comprising silicon nitride are partially or completely removed by means of etch processes.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein comprises providing a semiconductor structure comprising a transistor. The transistor comprises a gate electrode and a silicon nitride sidewall spacer formed at the gate electrode. A wet etch process removing at least a portion of the silicon nitride sidewall spacer is performed. The wet etch process comprises applying an etchant comprising at least one of hydrofluoric acid and phosphoric acid.

Another illustrative method disclosed herein comprises providing a semiconductor structure comprising a first feature formed of a first material comprising silicon nitride and a second feature formed of a second material comprising at least one of silicon dioxide, hafnium oxide, hafnium silicon oxynitride, silicon, silicon/germanium, a metal, a silicide and a germano-silicide. The first feature is etched selectively with respect to the second feature. The etching comprises exposing the first feature and the second feature to an etchant comprising hydrofluoric acid at a concentration in a range from about 0.0057-0.057 percent by mass at a temperature in a range from about 40-100° C.

A further illustrative method disclosed herein comprises providing a semiconductor structure comprising a first feature formed of a first material comprising silicon nitride and a second feature formed of a second material comprising at least one of silicon dioxide, hafnium silicon oxynitride, silicon, silicon/germanium, a silicide and a germano-silicide. The first feature is etched selectively with respect to the second feature. The etching comprises exposing the first feature and the second feature to an etchant. The etchant comprises phosphoric acid at a concentration in a range from about 60-85 percent by mass at a temperature in a range from about 110-150° C.

BRIEF DESCRIPTION OF THE DRAWINGS

The disclosure may be understood by reference to the following description taken in conjunction with the accompanying drawings, in which like reference numerals identify like elements, and in which.

Figure 1A:
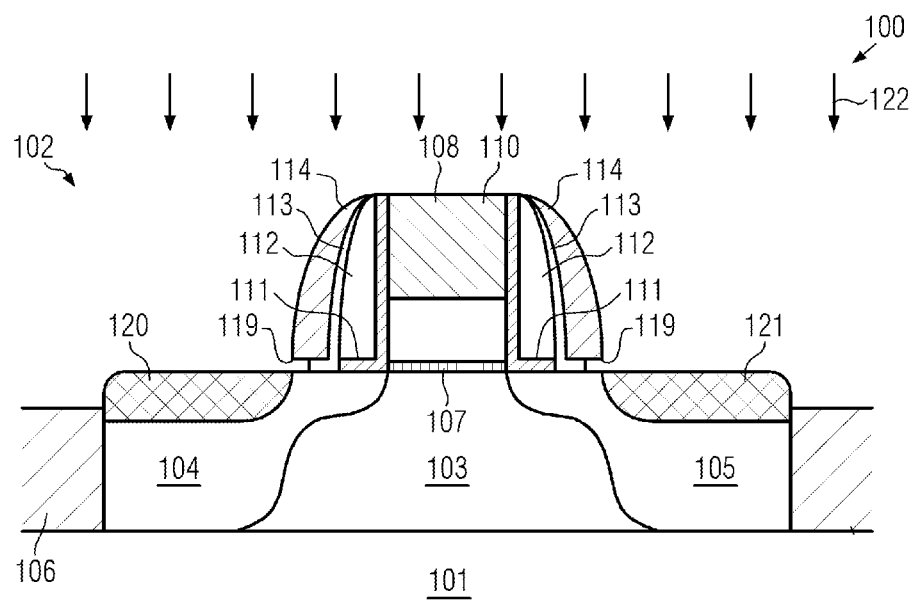
FIGS. 1a and 1b schematically illustrate cross-sectional views of a semiconductor structure in stages of a conventional method of forming a semiconductor structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides methods wherein silicon nitride in a semiconductor structure is etched selectively with respect to other materials of the semiconductor structure by means of a wet etch process. Due to the selectivity of the wet etch process, an etch rate of silicon nitride exposed to an etchant used in the wet etch process may be greater than an etch rate of other materials. The etch rate may be expressed quantitatively by a thickness of a portion of a feature such as, for example, a material layer formed from a particular material that is removed per unit of time when the material is exposed to the etchant. Typically, the etch rate is expressed in the unit angstrom per minute.

In embodiments, an etchant used in the wet etch process may comprise diluted hydrofluoric acid. At relatively high concentrations of hydrofluoric acid and relatively low temperature, an etch rate of silicon nitride obtained in a wet etch process wherein hydrofluoric acid is employed may be smaller than an etch rate of silicon dioxide. However, at relatively low concentrations of hydrofluoric acid that may be obtained, for example, by diluting concentrated hydrofluoric acid with a relatively large amount of water, and at relatively high temperature, the etch rate of silicon nitride obtained in the wet etch process may be greater than the etch rate of silicon dioxide, so that silicon nitride may be selectively removed with respect to silicon dioxide.

In other embodiments, the etchant used in the wet etch process may comprise phosphoric acid, wherein relatively high concentrations of phosphoric acid and a relatively high temperature at which the wet etch process is performed may be employed.

In embodiments, a wet etch process as described above may be used for selectively removing a silicon nitride sidewall spacer that is formed at a gate electrode of a field effect transistor formed in a semiconductor structure.

Since an etchant used in a wet etch process as described above may provide relatively low etch rates for semiconductor materials used in the formation of transistors, such as silicon and/or silicon/germanium, a formation of pits at portions of the transistor wherein the semiconductor material is exposed to the etchant may be avoided or at least reduced. Moreover, removing a silicon nitride sidewall spacer or a portion thereof by means of a wet etch process may help to avoid issues related to a sputtering of materials on the surface of the semiconductor structure, such as, for example, silicide formed in portions of a source region, a drain region and/or a gate electrode of the transistor.

Figure 2A:
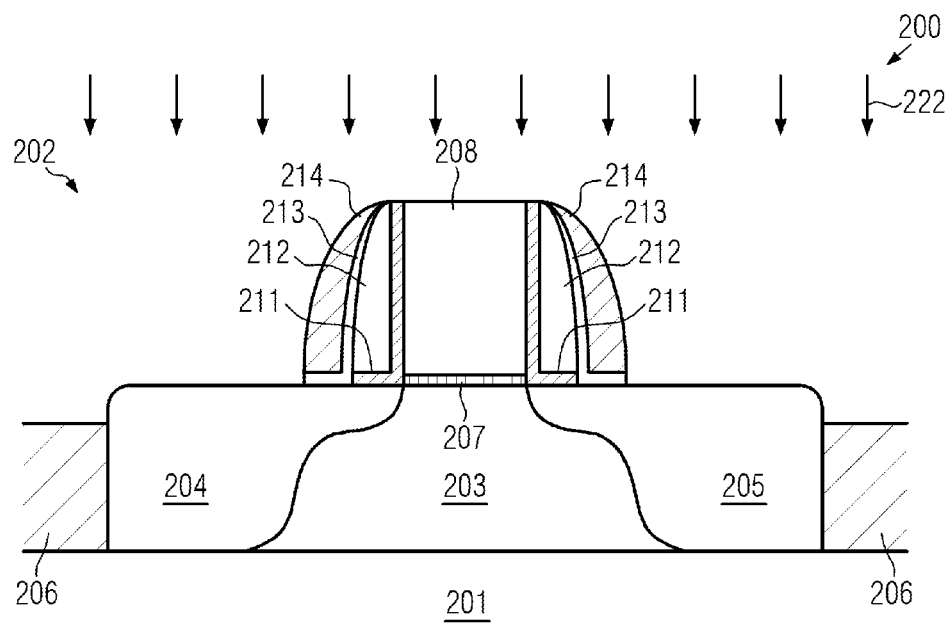
FIGS. 2a-2d show schematic cross-sectional views of a semiconductor structure in stages of a method according to an illustrative embodiment.

FIG. 2a shows a schematic cross-sectional view of a semiconductor structure 200 in a first stage of a manufacturing process according to an embodiment. The semiconductor structure 200 comprises a substrate 201, above which a semiconductor layer 203 is formed. The substrate 201 may represent any appropriate carrier material, such as a semiconductor material, a semiconductor material in combination with an insulating material and the like.

In embodiments, the semiconductor layer 203 in combination with the substrate 201 may form a silicon-on-insulator (SOI) configuration, wherein the semiconductor layer 203 is formed on an insulating surface portion of the substrate 201, for example on a portion of a surface of an insulating layer formed on a semiconductor wafer.

In other embodiments, the semiconductor layer 203 and the substrate 201 may form a bulk configuration, wherein the semiconductor layer 203 is formed on a substantially crystalline semiconductor material of the substrate 201, and/or wherein the semiconductor layer 203 and the substrate 201 are integral.

The semiconductor layer 203 and/or a semiconductor material in the substrate 201 may comprise silicon, for example substantially pure silicon. In other embodiments, the semiconductor layer 203 may comprise a semiconductor material other than substantially pure silicon, for example silicon/germanium, which may help to provide a strain in the semiconductor layer 203. The strain can increase the mobility of electrons and/or holes in the semiconductor layer 203.

The semiconductor structure 200 may further comprise an insulation structure 206 which may, in embodiments, be provided in the form of a shallow trench isolation that separates a portion of the semiconductor layer 203 enclosed by the insulation structure 206 from other portions of the semiconductor layer 203 (not shown).

The portion of the semiconductor layer 203 enclosed by the insulation structure 206 may form an active region of a field effect transistor 202, and may comprise a specific well doping, the type of doping being selected in accordance with the type of the field effect transistor 202. For forming an N-channel field effect transistor 202, the portion of the semiconductor layer 203 enclosed by the insulation structure 206 may be doped with a P-type dopant, and it may be doped with an N-type dopant if a P-channel field effect transistor 202 is formed.

The field effect transistor 202 comprises a gate electrode 208 that is separated from the semiconductor layer 203 by a gate insulation layer 207.

The gate insulation layer 207 may comprise a high-k material having a dielectric constant that is greater than the dielectric constant of silicon dioxide. In embodiments, the gate insulation layer 207 or a portion thereof may be formed of hafnium oxide and/or hafnium silicon oxynitride. In other embodiments, the gate insulation layer 207 may be formed of silicon dioxide.

The gate electrode 208 may comprise polysilicon and/or one or more metals. In embodiments, the gate electrode 208 may comprise one or more layers formed of titanium nitride and/or aluminum. For example, the gate electrode 208 may have TiN—Al—TiN configuration. In other embodiments, the gate electrode 208 may be formed of polysilicon.

At the gate electrode 208, a silicon dioxide sidewall spacer 212 and a silicon nitride sidewall spacer 214 may be formed, wherein the silicon dioxide sidewall spacer 212 may be formed between the gate electrode 208 and the silicon nitride sidewall spacer 214. A first liner layer 211 that may comprise silicon nitride may be formed between the gate electrode 208 and the silicon dioxide sidewall spacer 212, and a second liner layer 213 that may comprise silicon dioxide may be formed between the silicon dioxide sidewall spacer 212 and the silicon nitride sidewall spacer 214.

A portion of the first liner layer 211 may extend below the silicon dioxide sidewall spacer 212, so that the silicon dioxide sidewall spacer 212 is separated from the semiconductor layer 203 by the first liner layer 211. A portion of the second liner layer 213 may extend below the silicon nitride sidewall spacer 214, so that the silicon nitride sidewall spacer 214 is separated from the semiconductor layer 203 by the second liner layer 213.

The field effect transistor 202 may further comprise a source region 204 and a drain region 205. The source region 204 and the drain region 205 may be doped inversely to a doping of a channel region of the field effect transistor 202 that is provided below the gate electrode 208. Hence, in embodiments wherein the field effect transistor 202 is a P-channel field effect transistor, the channel region comprises an N-type dopant, and the source region 204 and the drain region 205 comprise a P-type dopant. In embodiments wherein the field effect transistor 202 is an N-channel transistor, the channel region comprises a P-type dopant, and the source region 204 and the drain region 205 comprise an N-type dopant.

The gate electrode 208 may extend in a direction perpendicular to the plane of drawing of FIGS. 2a-2d. In some embodiments, the gate electrode 208 may extend over the insulation structure 206 enclosing the active region of the field effect transistor 202, and may be integral with a gate electrode of a field effect transistor (not shown) adjacent the field effect transistor 202. Thus, a gate voltage may be simultaneously applied to gate electrodes of the field effect transistor 202 and the adjacent field effect transistor.

The semiconductor structure 200 as shown in FIG. 2a may6 be formed by means of well-established methods of forming semiconductor structures, including lithography techniques, etch techniques, ion implantation techniques, as well as deposition and planarization processes.

Silicide portions 220, 221 in the source region 204 and, optionally, a silicide portion 210 in the gate electrode 208 (see FIG. 2c) may be formed.

The formation of the silicide portions 220, 221, 210 may comprise a preclean process, as schematically illustrated by arrows 222 in FIG. 2a. The preclean process may remove contaminants from the source region 204, the drain region 205 and/or the gate electrode 208. Moreover, the preclean process 222 may remove a native silicon oxide from the source region 204, the drain region 205 and, in embodiments wherein the gate electrode 208 comprises silicon, from the gate electrode 208.

The preclean process 222 may comprise exposing the semiconductor structure 200 to a reducing gas, such as hydrogen or ammonia, and an inert gas, such as argon, helium or nitrogen. Additionally or alternatively, the preclean process 222 may comprises a remote plasma preclean, wherein the semiconductor structure 200 is provided in a reaction chamber and exposed to a plasma that is created in a plasma generation chamber that is separate from the reaction chamber. In embodiments, the plasma may be created by an electric discharge in an etch gas comprising $CF_4$, $SF_6$ and/or $NF_3$. Alternatively or additionally, a plasma preclean process wherein the plasma is created directly in the reaction chamber may be performed. In further embodiments, the preclean process 222 may comprise a wet cleaning process employing hydrofluoric acid.

For removing a native silicon oxide from the semiconductor structure 200, the preclean process 222 may be adapted for removing silicon dioxide. Hence, in embodiments wherein the second liner layer 213 comprises silicon dioxide, the preclean process 222 may affect the second liner layer 213.

The preclean process 222 may be substantially isotropic, so that the rate at which silicon dioxide is removed from a portion of the surface of the semiconductor structure 200 does not depend on the orientation of the surface portion, or depends on the orientation of the surface portion to a relatively low extent. Thus, in the preclean process 222, portions of the second liner layer 213 below the silicon nitride sidewall spacer 214 may be removed, and overhangs 219 (see FIG. 2b) of the silicon nitride spacer 214 may be formed. Below the overhangs 219, the semiconductor material of the source region 204 and the drain region 205 may be exposed.

Figure 2B:
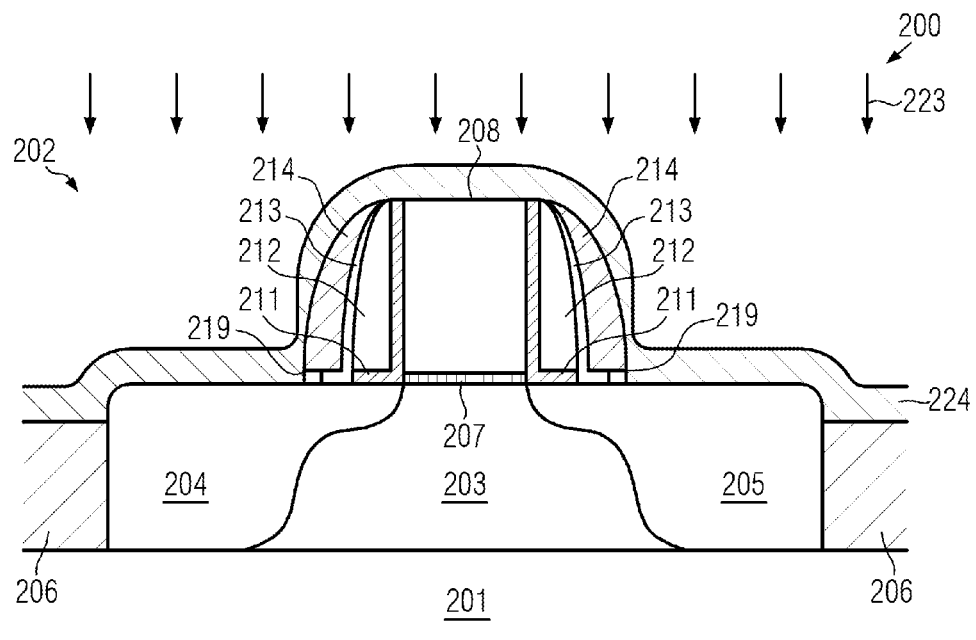

FIG. 2b shows a schematic cross-sectional view of the semiconductor structure 200 in a stage of the manufacturing process after the preclean process 222. A metal layer 224 may be formed over the semiconductor structure 200. The metal layer 224 may, in particular, cover the source region 204, the drain region 205 and the gate electrode 208. The metal layer 224 may comprise nickel. In other embodiments, the metal layer 224 may comprise a metal other than nickel, for example titanium or cobalt.

The metal layer 224 may be formed by means of a physical vapor deposition process, as schematically illustrated by arrows 223 in FIG. 2b. The physical vapor deposition process 223 may comprise a sputter deposition process, wherein a target electrode formed of the metal used for the metal layer 224 is employed.

The process 223 employed for the formation of the metal layer 224 may be an anisotropic deposition process, wherein a rate at which metal is deposited on substantially horizontal portions of the semiconductor structure 200 such as, for example, the surfaces of the source region 204 and the drain region 205, and the top surface of the gate electrode 208 is greater than a rate at which metal is deposited on inclined surface portions such as, for example, the side surfaces of the silicon nitride sidewall spacer 214. An even lower deposition rate, or substantially no deposition of metal at all, may be obtained below the overhangs 219 of the silicon nitride sidewall spacer. Therefore, the metal layer 224 may have a greater thickness on substantially horizontal portions of the surface of the semiconductor structure 200 than on inclined surface portions, and voids may be formed below the overhangs 219 of the silicon nitride sidewall spacer 214.

Figure 2C:
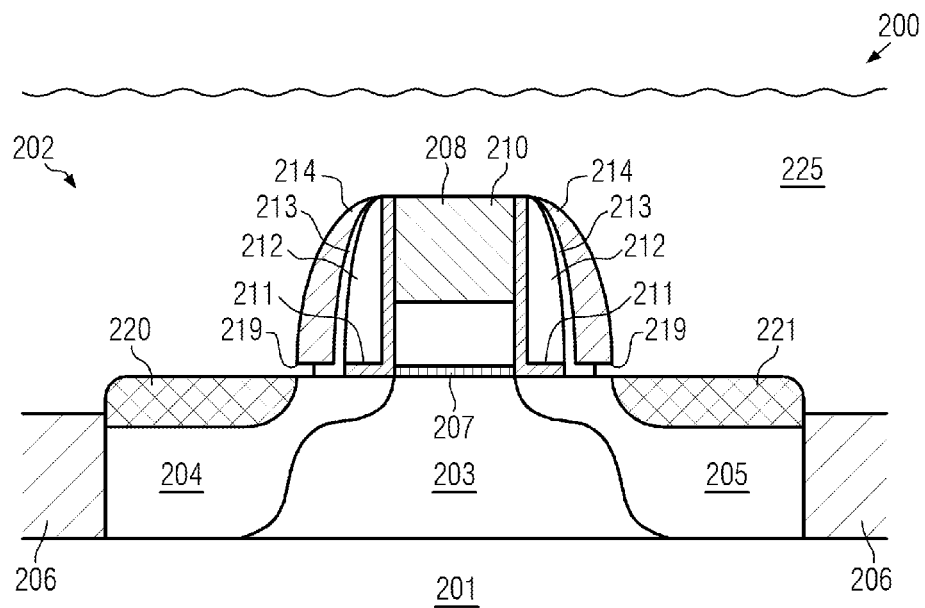

FIG. 2c shows a schematic cross-sectional view of the semiconductor structure 200 in a later stage of the manufacturing process.

After the formation of the metal layer 224, a chemical reaction between the metal of the metal layer 224 and the semiconductor material of the source region 204, the drain region 205 and, optionally, the gate electrode 208, may be initiated. The initiation of the chemical reaction may comprise a thermal process, for example, a rapid thermal annealing process, wherein the semiconductor structure 200 is exposed to a temperature, for example in a range between about 300-800° C., for a relatively short time, for example about 30 seconds, in an inert gas atmosphere that may, for example, comprise nitrogen.

In embodiments wherein the semiconductor layer 203 comprises silicon, the chemical reaction between the metal of the layer 224 and the silicon in the layer 203 may create a silicide portion 220 in the source region 204 and a silicide portion 221 in the drain region 205. In embodiments wherein the semiconductor material of the layer 203 comprises silicon/germanium, the chemical reaction between the metal of the layer 224 and the silicon/germanium may create a germano-silicide, so that the silicide portions 220, 221 comprise a germano-silicide. Moreover, in embodiments wherein the gate electrode 208 comprises silicon or silicon/germanium, a silicide or germano-silicide, respectively, may be formed in a chemical reaction between the silicon or silicon/germanium, respectively, and the metal, so that the gate electrode 208 comprises a silicide portion 210 comprising a silicide and/or a germano-silicide.

After the chemical reaction between the metal of the metal layer 224 and the material of the semiconductor layer 203 and, optionally, the gate electrode 208, unreacted metal may be removed. In embodiments wherein the metal layer 224 comprises nickel, this may be done by means of a mixture of sulfuric acid and hydrogen peroxide. If the metal layer 224 comprises titanium or cobalt, a mixture of an aqueous solution of ammonium hydroxide and hydrogen peroxide may be used for removing unreacted metal.

After the removal of unreacted metal from the metal layer 224 from the semiconductor structure 200, silicide of the silicide portions 220, 221 in the source region 204 and the drain region 205, respectively, is exposed at the surface of the semiconductor structure 200. In embodiments wherein the gate electrode 208 comprises polysilicon or silicon/germanium, and metal from the metal layer 224 reacts with the polysilicon or silicon/germanium, the silicide portion 210 of the gate electrode 208 is exposed at the surface of the semiconductor structure 200. In addition to silicide, silicon dioxide of the trench insulation structure 206, the silicon dioxide sidewall spacer 212 and the second liner layer 213 may also be exposed at the surface of the semiconductor structure. Furthermore, silicon nitride of the silicon nitride sidewall spacer 214 may be exposed at the surface of the semiconductor structure 200.

If voids are formed below overhangs 219 of the silicon nitride sidewall spacer 214 during the formation of the metal layer 224, as described above, the silicide portions 220, 221 of the source region 204 and the drain region 205 need not extend to the second liner layer 213. Instead, one or more portions wherein the semiconductor material of the semiconductor layer 203 is exposed may be present between the second liner layer 213 and the silicide portions 220, in particular below the overhangs 219.

A wet etch process may be performed for removing at least a portion of the silicon nitride sidewall spacer 214. In the wet etch process, the semiconductor structure 200 is exposed to a liquid etchant 225, for example by inserting the semiconductor structure 200 into the liquid etchant 225, or by spraying the liquid etchant 225 to the surface of the semiconductor structure 200. Thus, features at the surface of the semiconductor structure 200, in particular the insulation structure 206, the silicide portions 220, 221 in the source region 204 and the drain region 205, the gate electrode 208, the silicon dioxide sidewall spacer 212, the liner layers 211, 213 and the silicon nitride sidewall spacer 214 are exposed to the etchant. If portions of the semiconductor layer 203 are exposed below overhangs 219 of the silicon nitride sidewall spacer 214, these portions may also be exposed to the etchant.

A temperature at which the wet etch process is performed may be adapted by providing an appropriate temperature of the etchant 225 and/or a temperature of an environment wherein the wet etch process is performed. In embodiments wherein the semiconductor structure 200 is inserted into the etchant 225, a temperature-controlled etchant bath may be provided. In embodiments wherein the etchant 225 is sprayed to the surface of the semiconductor structure 200, the etch process may be performed in a temperature-controlled chamber.

The etchant 225 may be adapted for removing silicon nitride with a greater etch rate than materials of other features of the semiconductor structure 200 that are exposed at the surface of the semiconductor structure 200, so that silicon nitride is removed selectively with respect to one or more of the other materials exposed at the surface of the semiconductor structure 200.

In particular, the wet etch process may be adapted for removing the silicon nitride of the silicon nitride sidewall spacer 214 selectively with respect to silicon dioxide, silicon, silicon/germanium, silicide and/or germano-silicide. In embodiments, the etchant 225 may also be adapted for etching silicon nitride selectively with respect to metals that may be present in the gate electrode, for example titanium nitride and aluminum, and high-k dielectric materials, such as hafnium oxide and/or hafnium silicon oxynitride, which may be present in the gate insulation layer 207.

In embodiments, the etchant 225 may comprise hydrofluoric acid. An etchant 225 for etching silicon nitride selectively with respect to other materials exposed at the surface of the semiconductor structure 200 as described above may be obtained by adapting the concentration of the hydrofluoric acid and the temperature at which the wet etch process is performed such that the desired selectivity of the etch process is obtained, as will be explained in more detail in the following.

The concentration of the hydrofluoric acid may be adapted by diluting concentrated hydrofluoric acid with water, wherein a dilution ratio, being a ratio between a volume of water and a volume of concentrated hydrofluoric acid that are mixed for diluting the concentrated hydrofluoric acid, is selected such that a desired concentration of the diluted hydrofluoric acid is obtained.

In embodiments, diluted hydrofluoric acid that may be used as etchant 225 may be obtained by diluting concentrated hydrofluoric acid having a concentration of about 49 percent by mass.

TABLE 1

| dHF | Temp (° C.) | Etch Rate of the $Si_3N_4$ sidewall spacer (A/min) | Etch Rate of the $SiO_2$ liner layer (A/min) | Selectivity |
|---|---|---|---|---|
| 500:1 | 25 | 14.4 | 20 | 0.7 |
| 1000:1 | 25 | 8.1 | 7 | 1.2 |
| 1500:1 | 25 | 5.5 | 3.4 | 1.6 |
| 2000:1 | 25 | 4.4 | 1.8 | 2.4 |
| 3000:1 | 25 | 2.8 | 0.6 | 4.7 |
| 4000:1 | 25 | 2.2 | 0.4 | 5.5 |
| 5000:1 | 25 | 1.9 | 0.2 | 9.5 |
| 500:1 | 40 | 36.8 | 36.1 | 1 |
| 1000:1 | 40 | 17.2 | 9.7 | 1.8 |
| 1500:1 | 40 | 11.7 | 4.5 | 2.6 |
| 2000:1 | 40 | 9.1 | 2.3 | 4 |
| 3000:1 | 40 | 5.7 | 0.9 | 6.3 |
| 4000:1 | 40 | 4.5 | 0.5 | 9 |
| 5000:1 | 40 | 3.5 | 0.2 | 17.5 |
| 500:1 | 60 | 84.4 | 55.3 | 1.5 |
| 1000:1 | 60 | 43.7 | 15.3 | 2.9 |
| 1500:1 | 60 | 31.2 | 6.4 | 4.9 |
| 2000:1 | 60 | 23.4 | 3.5 | 6.7 |
| 3000:1 | 60 | 14.3 | 1.3 | 11 |
| 4000:1 | 60 | 11.8 | 0.6 | 19.7 |
| 5000:1 | 60 | 9.5 | 0.4 | 23.8 |
| 500:1 | 80 | 161.7 | 79.5 | 2 |
| 1000:1 | 80 | 80.3 | 18.9 | 4.2 |
| 1500:1 | 80 | 56.9 | 8.8 | 6.5 |
| 2000:1 | 80 | 43.8 | 5.2 | 8.4 |
| 3000:1 | 80 | 32.3 | 2 | 16.2 |
| 4000:1 | 80 | 25.5 | 1.1 | 23.2 |
| 5000:1 | 80 | 21 | 0.7 | 30 |

Table 1 shows the results of experiments wherein the etch rate of silicon nitride sidewall spacers similar to the silicon nitride sidewall spacer 214 shown in FIG. 2c and the etch rate of a silicon dioxide liner layer similar to the second liner layer 213 shown in FIG. 2c were measured for a number of dilution ratios of hydrofluoric acid and for a number of different temperatures at which the etch process was performed.

The diluted hydrofluoric acid was obtained by diluting concentrated hydrofluoric acid having a concentration of 49 percent by mass at the dilution ratios specified in the first column. The temperature at which the etch process was performed is shown in the second column. The third column shows the etch rate of the silicon nitride sidewall spacer and the fourth column shows the etch rate of the silicon dioxide liner layer. The fifth column of Table 1 shows the selectivity of the etch process, being a ratio between the etch rate of the silicon nitride sidewall spacer and the etch rate of the silicon dioxide liner layer.

As can be seen from Table 1, both the etch rate of the silicon nitride sidewall spacer and the etch rate of the silicon dioxide liner layer decrease with increasing dilution of the hydrofluoric acid. However, the etch rate of the silicon dioxide liner layer decreases faster than the etch rate of the silicon nitride sidewall spacer, so that the selectivity of the etch process increases with increasing dilution of the hydrofluoric acid.

Moreover, from Table 1 it can be seen that, at higher temperature, greater etch rates are obtained both for silicon nitride and for silicon dioxide. The etch rate of silicon nitride increases to a greater extent than the etch rate of silicon dioxide when the temperature at which the etch process is performed is increased, so that a greater selectivity of the etching of silicon nitride with respect to the etching of silicon dioxide may be obtained when the etch process is performed at a higher temperature.

Accordingly, a relatively high selectivity of the etching of silicon nitride with respect to silicon dioxide may be obtained by using a relatively low concentration of the hydrofluoric acid and a relatively high temperature of the etch process. However, since the etch rate of silicon nitride decreases with decreasing concentration of the hydrofluoric acid, in some embodiments, a moderately low concentration of the hydrofluoric acid may be used for completely or partially removing the silicon nitride sidewall spacer 214, so that the process time required for completely or partially removing the silicon nitride sidewall spacer 214 is reduced compared to embodiments wherein a very low concentration of the hydrofluoric acid is used.

In embodiments, the concentration of the hydrofluoric acid may be in a range from about 0.0057-0.057 percent by mass, corresponding to dilution ratios of concentrated hydrofluoric acid having a concentration of 49 percent by mass in a range from about 1000:1 to about 10000:1, and the temperature of the wet etch process may be in a range from about 40-100° C.

In embodiments, the concentration of the hydrofluoric acid and the temperature at which the wet etch process is performed may be adapted such that an etch rate of silicon nitride is greater than an etch rate of silicon dioxide, greater than 5 times the etch rate of silicon dioxide, greater than 10 times the etch rate of silicon dioxide and/or greater than 20 times the etch rate of silicon dioxide. Suitable concentrations and temperatures of the hydrofluoric acid for obtaining a desired selectivity of the etch process may be determined on the basis of Table 1, or by performing experiments wherein the etch rates of silicon nitride and silicon dioxide are measured as a function of the concentration of the hydrofluoric acid and temperature. Depending on the type of process used for depositing silicon oxide and silicon nitride, and parameters of the deposition process, in some embodiments, etch rates obtained for silicon oxide and silicon nitride may deviate from the values shown in Table 1 to a certain, relatively low extent. In such embodiments, temperature and/or concentration of the hydrofluoric acid may be adapted on the basis of experiments to provide a desired selectivity of the etch process.

In embodiments, the concentration of the hydrofluoric acid may be in a range from about 0.0095-0.032 percent by mass and/or in a range from about 0.0095-0.014 percent by mass, corresponding to a dilution of concentrated hydrofluoric acid having a concentration of 49% with water at a volume ratio of water to hydrofluoric acid in a range from about 1800:1 to about 6000:1 and/or in a range from about 4000:1 to about 6000:1. The temperature at which the etch process is performed may be in a range from about 60-100° C. and/or in a range from about 70-90° C. In embodiments, the concentrated hydrofluoric acid may be diluted with water at a dilution ratio of 5000:1, and the wet etch process may be performed at a temperature of about 80° C.

TABLE 2

|  | 60 C. | | 80 C. | |
| --- | --- | --- | --- | --- |
|  | 4000:1 dHF | 5000:1 dHF | 4000:1 dHF | 5000:1 dHF |
| 300Å SiN Process Time | 26 min | 32 min | 12 min | 15 min |
| Sheet Resistance Increase (300Å Process Time) | | | | |
| NiSi | 0.19% | 0.27% | 0.15% | 0.17% |
| NiSiGe | 0.75% | 0.64% | 0.42% | 0.44% |
| Gate Etch Rates (Å/min) | | | | |
| HfSiON | 0.5 | 0.4 | 1.6 | 1.3 |
| HfOx | 3.2 | 2.5 | 7.7 | 5.7 |
| TiN-Al-TiN | 3.9 | 3.7 | 10 | 9.8 |

Table 2 shows the process time required for removing a silicon nitride layer having a thickness of 300 Å, the increase of the sheet resistance of layers of nickel silicide and nickel germano-silicide obtained after exposure of the layer of nickel silicide or nickel germano-silicide to the etchant for a time interval required for removing a silicon nitride layer having a thickness of 300 Å, and etch rates of materials that may be employed in the formation of gate electrodes and gate insulation layers of field effect transistors for wet etch processes performed at temperatures of 60° C. and 80° C. with hydrofluoric acid obtained by dilution of concentrated hydrofluoric acid having a concentration of 49 percent by mass at a volume ratio of 4000:1 and 5000:1 of water to concentrated hydrofluoric acid.

As can be seen from Table 2, only a moderately low increase of the sheet resistance of nickel silicide and nickel germano-silicide is obtained, indicating that the nickel silicide and the nickel germano-silicide are affected by the etch process to a relatively low extent. Accordingly, by employing a wet etch process wherein an etchant comprising hydrofluoric acid is used for removing the silicon nitride sidewall spacer 214, an adverse influence of the wet etch process for removing the silicon nitride sidewall spacer 214 on the conductivity of the silicide portions 220, 221, 210 of the source region 204, the drain region 205 and the gate electrode 208, respectively, may be avoided or at least reduced. Moreover, since hafnium silicon oxynitride, hafnium oxide, as well as titanium nitride and aluminum gate electrodes are affected by the etchant to a relatively low extent, an adverse influence of the wet etch process on transistors comprising a high-k material in the gate insulation layer 207 and/or a metal gate electrode 208 may be avoided or at least reduced.

In other embodiments, the etchant 225 may comprise phosphoric acid. The phosphoric acid may have a concentration in a range from about 60-85 percent by mass and a temperature in a range from about 110-150° C., wherein the temperature of the phosphoric acid may be selected such that it is below the boiling point of the phosphoric acid at the respective concentration. In embodiments, the concentration of the phosphoric acid may be in a range from about 65-70 percent by mass, and the temperature of the phosphoric acid may be in a range from about 110-130° C. For example, the phosphoric acid may have a temperature of about 120° C.

TABLE 3

|  | 120 C. 65% $H_3PO_4$ | 120 C. 70% $H_3PO_4$ | 120 C. 75% $H_3PO_4$ | 120 C. 85% $H_3PO_4$ |
| --- | --- | --- | --- | --- |
| Spacer Etch Rates (Å/min) | | | | |
| $Si_3N_4$ sidewall spacer | 22 | 25.6 | 23.6 | 18.1 |
| $SiO_2$ liner layer | 0.9 | 1.1 | 1.3 | 1.4 |
| Nitride-Oxide Selectivity | 24.4 | 23.3 | 18.2 | 12.9 |
| 300Å SiN Process Time | 14 min | 12 min | 13 min | 17 min |
| Sheet Resistance Increase (300Å Process Time) | | | | |
| NiSi | 0.5% | 0.8% | 1.0% | 1.6% |
| NiSiGe | 1.3% | 1.4% | 1.3% | 3.3% |
| Gate Etch Rates (Å/min) | | | | |
| HfSiON | 2.0 | 2.0 | 2.6 | 2.1 |
| HfOx | >17 | >17 | >17 | >17 |
| TiN-Al-TiN | 19.8 | 19.7 | 17.7 | 13.2 |

Table 3 shows etch rates of silicon nitride sidewall spacers similar to the silicon nitride sidewall spacer 214 shown in FIG. 2c and a silicon dioxide liner layer similar to the second liner layer 213 shown in FIG. 2c, a selectivity of the etching of silicon nitride with respect to silicon dioxide, a process time required for removing a silicon nitride layer having a thickness of 300 Å, an increase of the sheet resistance of nickel silicide and nickel germano-silicide obtained after exposure of the nickel silicide and the nickel germano-silicide to the etchant for the process time required for removing a silicon nitride layer having a thickness of 300 Å and etch rates of materials employed for metal gate electrodes and high-k gate insulation layers for phosphoric acid concentrations of 65 percent, 70 percent, 75 percent and 85 percent by mass at a temperature of 120° C.

As can be seen from Table 3, performing a wet etch process wherein an etchant comprising phosphoric acid is used allows selectively removing silicon nitride with respect to silicon dioxide, nickel silicide, nickel germano-silicide and hafnium silicon oxynitride.

Accordingly, in embodiments, a wet etch process wherein an etchant comprising phosphoric acid is used may be employed for completely or partially removing the silicon nitride sidewall spacer 214. Since relatively high etch rates of hafnium oxide and a TiN—Al—TiN gate electrode may be obtained for an etchant comprising phosphoric acid, wet etch processes wherein an etchant comprising phosphoric acid is used may be employed in embodiments wherein other materials are provided in the semiconductor structure 200 and/or wherein the gate electrode 208 is protected by features such as, for example, a capping layer.

Since wet etch processes wherein an etchant 225 comprising hydrofluoric acid and/or phosphoric acid is employed can affect silicon and silicon-germanium to a relatively low extent, a formation of pits adjacent the silicide portions 220, 221 of the source region 204 and the drain region 205 may be avoided or at least reduced, even if portions of the semiconductor layer 203 are exposed below overhangs 219 of the silicon nitride sidewall spacer 214.

Figure 1B:
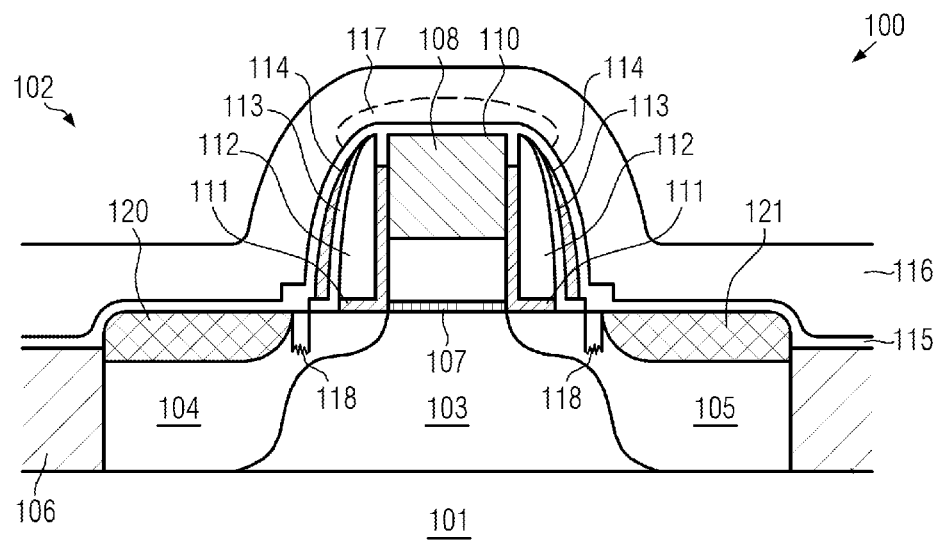

Furthermore, using a wet etch process wherein an etchant 225 comprising hydrofluoric acid and/or phosphoric acid is employed can allow avoiding a sputtering of silicide and/or germano-silicide in portions 220, 221, 210, which may occur if a reactive ion etch process as described above with respect to FIGS. 1a and 1b is employed. This may help to avoid or at least reduce an increase of the parasitic capacitance between the gate electrode 208 and contact structures used for providing electric contact to the source region 204 and the drain region 205. Moreover, a formation of nickel silicide foam defects may be avoided or at least reduced, the process complexity may be reduced compared to embodiments wherein reactive ion etching is employed, and a wet etch process may be implemented as a bench process, which may entail greater throughput and reduced cost.

Moreover, a wet etch process wherein an etchant 225 comprising hydrofluoric acid and/or phosphoric acid is used for removing the silicon nitride sidewall spacer 214 may help to provide a greater selectivity of the etching of silicon nitride with respect to the etching of silicon dioxide than a reactive ion etch process as described above with respect to FIGS. 1a and 1b. This may help to avoid or at least reduce an etching of the second liner layer 213 and/or the silicon dioxide sidewall spacer 212, and may help to avoid or at least reduce an etching of the insulation structure 206 in embodiments wherein the insulation structure 206 comprises silicon dioxide. A reduced etching of the insulation structure 206 may help to avoid an increased topology of the semiconductor structure 200, which might lead to a formation of voids in the deposition of an interlayer dielectric over the semiconductor structure 200.

Figure 2D:
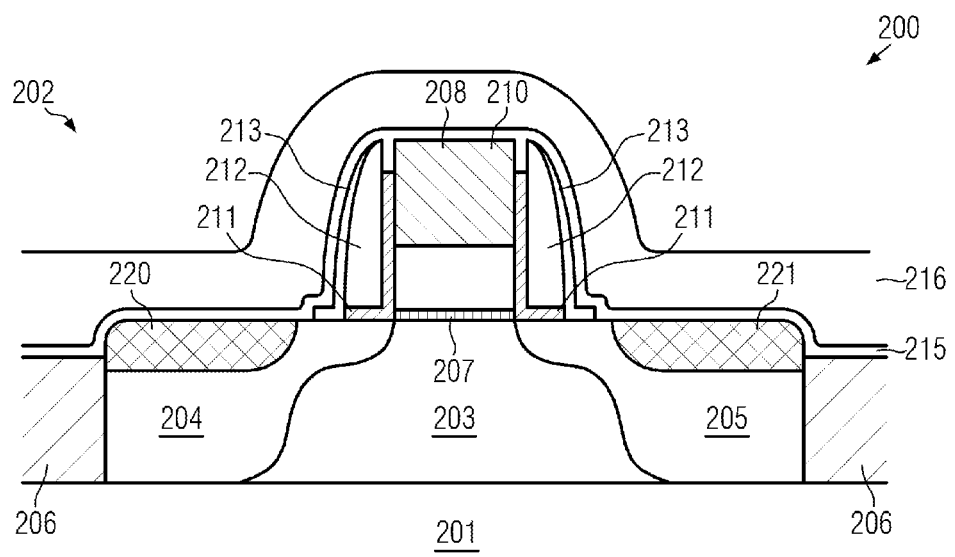

FIG. 2d shows a schematic cross-sectional view of the semiconductor structure 200 in a later stage of the manufacturing process. After removing the silicon nitride sidewall spacer 214 or a portion thereof by means of a wet etch process, an etch stop layer 215 and a stressed dielectric layer 216 may be formed above the field effect transistor 202. The etch stop layer 215 and the stressed dielectric layer 216 may be formed by means of known processes used for forming etch stop layers and stressed dielectric layers, such as, for example, plasma-enhanced chemical vapor deposition. In some embodiments, the stressed dielectric layer 216 may comprise silicon nitride, and may have a tensile or compressive intrinsic stress.

In some embodiments, the stressed dielectric layer 216 may be removed from field effect transistors of one type, for example from P-channel transistors, and a further stressed dielectric layer (not shown) having a different type of stress than the stressed dielectric layer 216 may be formed over the field effect transistors of the one type. In embodiments, a stressed dielectric layer having a tensile stress may be formed over N-channel field effect transistors, and a stressed dielectric layer having a compressive stress may be formed over P-channel field effect transistors. Thus, a different strain may be provided in N-channel field effect transistors and in P-channel field effect transistors.

Thereafter, further known processes for forming a semiconductor structure may be performed, which may include the deposition of a dielectric layer and the formation of contacts for contacting the source region 204, the drain region 205 and the gate electrode 208.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor structure comprising a transistor that is formed in and above a semiconductor layer, the transistor comprising a gate electrode, a silicon nitride sidewall spacer formed at the gate electrode, and a liner layer positioned between said silicon nitride sidewall spacer and said gate electrode and below said silicon nitride sidewall spacer, wherein at least one overhang is formed below said silicon nitride spacer and above an exposed portion of said semiconductor layer, and
performing a wet etch process removing at least a portion of the silicon nitride sidewall spacer, wherein the wet etch process comprises applying an etchant comprising at least one of hydrofluoric acid and phosphoric acid.

2. The method of claim 1, wherein said semiconductor structure further comprises a source region and a drain region adjacent said silicon nitride sidewall spacer, and wherein said source region, said drain region and said gate electrode are exposed to said etchant in said wet etch process.

3. The method of claim 2, wherein at least one of said source region, said drain region and said gate electrode comprises at least one of a silicide and a germano-silicide.

4. The method of claim 2, wherein said gate electrode comprises a metal.

5. The method of claim 2, wherein said semiconductor structure further comprises an insulation structure, and wherein said insulation structure is exposed to said etchant in said wet etch process.

6. The method of claim 2, further comprising:
performing an isotropic preclean process removing contaminants from said source region and said drain region, the isotropic preclean process further removing a portion of said liner layer below said silicon nitride sidewall spacer so as to form said exposed portion of said semiconductor layer below said silicon nitride sidewall spacer;
anisotropically depositing a metal over said semiconductor structure; and
initiating a chemical reaction between said metal and a semiconductor material of said source region and said drain region;
wherein the isotropic preclean process, the anisotropic deposition of the metal and the initiation of the chemical reaction are performed before said wet etch process.

7. The method of claim 1, wherein said semiconductor structure further comprises a silicon dioxide sidewall spacer, said silicon dioxide sidewall spacer being formed between said gate electrode and said silicon nitride sidewall spacer.

8. The method of claim 1, further comprising forming a stressed dielectric layer over said transistor after said wet etch process.

9. The method of claim 8, wherein said semiconductor structure further comprises an insulation structure, wherein a portion of said gate electrode is formed over said insulation structure.

10. The method of claim 1, wherein said etchant comprises hydrofluoric acid, and wherein a concentration of the hydrofluoric acid and a temperature at which the wet etch process is performed are adapted such that an etch rate of silicon nitride is greater than at least one of an etch rate of silicon dioxide, five times an etch rate of silicon dioxide, ten times an etch rate of silicon dioxide and twenty times an etch rate of silicon dioxide.

11. The method of claim 1, wherein said etchant comprises phosphoric acid, and wherein a concentration of the phosphoric acid and a temperature at which the wet etch process are performed are adapted such that an etch rate of silicon nitride is greater than at least one of an etch rate of silicon dioxide, five times an etch rate of silicon dioxide, ten times an etch rate of silicon dioxide and twenty times an etch rate of silicon dioxide.

12. The method of claim 1, wherein said etchant comprises hydrofluoric acid at a concentration in at least one of a range from about 0.0057-0.057 percent by mass, a range from about 0.0095-0.032 percent by mass and a range from about 0.0095-0.014 percent by mass.

13. The method of claim 12, wherein said wet etch process is performed at a temperature in at least one of a range from about 40-100° C., a range from about 60-100° C. and a range from about 70-90° C.

14. The method of claim 1, wherein said etchant comprises phosphoric acid at a concentration in a range from about 60-85 percent by mass and said wet etch process is performed at a temperature in a range from about 110-150° C.

15. The method of claim 1, wherein said etchant is a substantially pure aqueous solution of hydrogen fluoride.

16. The method of claim 1, wherein said etchant is a substantially pure aqueous solution of phosphoric acid.

17. A method, comprising:
providing a semiconductor structure that is formed in and above a semiconductor layer, the semiconductor structure comprising a first feature formed of a first material comprising silicon nitride, a second feature formed of a second material comprising at least one of silicon dioxide, hafnium oxide, hafnium silicon oxynitride, silicon, silicon/germanium, a metal, a silicide and a germano-silicide, and a liner layer positioned between said silicon nitride sidewall spacer and said gate electrode and below said silicon nitride sidewall spacer, wherein at least one overhang is formed below said silicon nitride spacer and above an exposed portion of said semiconductor layer; and
etching said first feature selectively with respect to said second feature, the etching comprising exposing said first feature and said second feature to an etchant comprising hydrofluoric acid at a concentration in a range from about 0.0057-0.057 percent by mass at a temperature in a range from about 40-100° C.

18. The method of claim 17, wherein the concentration of said hydrofluoric acid is in a range from about 0.0095-0.032 percent by mass and the temperature is in a range from about 60-100° C.

19. The method of claim 17, wherein the concentration of said hydrofluoric acid is in a range from about 0.0095-0.014 percent by mass and the temperature is in a range from about 70-90° C.

* * * * *